US012690158B2

(12) United States Patent　(10) Patent No.:　US 12,690,158 B2

Tarter et al.　(45) Date of Patent:　Jul. 21, 2026

(54) HEAT DISSIPATING STRUCTURE AND HEAT DISSIPATING METHOD THEREOF

(71) Applicant: xMEMS Labs, Inc., Santa Clara, CA (US)

(72) Inventors: Thomas Tarter, San Jose, CA (US); Jemm Yue Liang, Sunnyvale, CA (US)

(73) Assignee: xMEMS Labs, Inc., Santa Clara, CA (US)

( * ) Notice: Subject to any disclaimer, the term of this patent is extended or adjusted under 35 U.S.C. 154(b) by 0 days.

(21) Appl. No.: 19/315,674

(22) Filed: Sep. 1, 2025

(65) Prior Publication Data

US 2026/0068077 A1 Mar. 5, 2026

Related U.S. Application Data

(60) Provisional application No. 63/693,207, filed on Sep. 11, 2024, provisional application No. 63/690,314, filed on Sep. 4, 2024.

(51) Int. Cl.
 H05K 7/20 (2006.01)

(52) U.S. Cl.
 CPC ..... H05K 7/20145 (2013.01); H05K 7/20209 (2013.01)

(58) Field of Classification Search
 CPC .............. H01L 23/467; H01L 23/4735; H05K 7/20136; H05K 7/20145; H05K 7/20163; H05K 7/20209; H05K 7/20918
 See application file for complete search history.

(56) References Cited

U.S. PATENT DOCUMENTS

| | | | | |
|---|---|---|---|---|
| 6,113,485 | A | * | 9/2000 | Marquis .................... G06F 1/20 165/80.3 |
| 9,898,056 | B2 | * | 2/2018 | Dean ........................ H05K 1/14 |
| 12,356,141 | B2 | * | 7/2025 | Liang ....................... H04R 1/42 |
| 2005/0231914 | A1 | * | 10/2005 | Mikubo .................... G06F 1/20 257/E23.098 |
| 2012/0073789 | A1 | * | 3/2012 | Bhattacharya ............ G06F 1/20 165/104.34 |
| 2013/0301218 | A1 | * | 11/2013 | Li ........................... G06F 1/203 361/695 |
| 2017/0276149 | A1 | * | 9/2017 | Dusseau ............ H05K 7/20136 |
| 2019/0035709 | A1 | * | 1/2019 | Lesartre ............... H01L 23/473 |
| 2021/0092871 | A1 | * | 3/2021 | Hur ..................... H05K 7/20163 |
| 2022/0221920 | A1 | * | 7/2022 | Shabbir .................... G06F 1/20 |
| 2022/0225031 | A1 | * | 7/2022 | Liang ..................... G10K 15/04 |
| 2024/0237266 | A1 | * | 7/2024 | Rathinasamy ..... H05K 7/20727 |

* cited by examiner

*Primary Examiner* — Eric S Ruppert
*Assistant Examiner* — Hans R Weiland
(74) *Attorney, Agent, or Firm* — Winston Hsu

(57) ABSTRACT

A heat dissipating structure and a heat dissipating method are disclosed. The heat dissipating structure includes a duct, which has a channel formed in the duct, and an airflow generating device. The heat dissipating structure is disposed on, by or over a semiconductor device and configured to dissipate heat generated from the semiconductor device. The airflow generating device is configured to generate an airflow flowing through the channel within the duct to dissipate the heat generated from the semiconductor device.

24 Claims, 17 Drawing Sheets

HEAT DISSIPATING STRUCTURE AND HEAT DISSIPATING METHOD THEREOF

CROSS REFERENCE TO RELATED APPLICATIONS

This application claims the benefit of U.S. Provisional Application No. 63/690,314, filed on Sep. 4, 2024. Further, this application claims the benefit of U.S. Provisional Application No. 63/693,207, filed on Sep. 11, 2024. The contents of these applications are incorporated herein by reference.

BACKGROUND OF THE INVENTION

1. Field of the Invention

The present invention relates to a heat dissipating structure and a heat dissipating method thereof, and more particularly, to a heat dissipating structure and a heat dissipating method thereof for cooling electronics and the like.

2. Description of the Prior Art

System-on-Chip (SoC) technology increases integration, but it also concentrates heat in smaller areas. As electronic devices become smaller and more powerful due to demands from AI, 5G, and advanced applications, cooling has become a critical challenge. Limited space and waterproofing requirements prevent the use of traditional active cooling (e.g., fans). Meanwhile, conventional passive cooling solutions like heat spreaders, vapor chambers, heat sinks, and advanced thermal materials can only keep temperatures in check. When heat cannot be dissipated effectively, it relies on thermal management such as throttling, which can cause 50% performance hit or even lead to device shutdown. As power density continues to rise, future compact devices (e.g., DIMM (Dual Inline Memory Module) cards) may require innovative active cooling solutions to ensure high performance and user safety.

SUMMARY OF THE INVENTION

It is therefore a primary objective of the present application to provide a heat dissipating structure and a heat dissipating method thereof, to improve over disadvantages of the prior art.

An embodiment of the present application discloses a heat dissipating structure comprising a duct, having a channel formed in the duct; and an airflow generating device; wherein the heat dissipating structure is disposed on, by or over a semiconductor device and configured to dissipate heat generated from the semiconductor device; wherein the airflow generating device is configured to generate an airflow flowing through the channel within the duct to dissipate the heat generated from the semiconductor device.

Another embodiment of the present application discloses a heat dissipating method, comprising forming a channel over a semiconductor device; and generating an airflow, by an airflow generating device, through the channel; wherein the airflow dissipates heat generated from the semiconductor device.

These and other objectives of the present invention will no doubt become obvious to those of ordinary skill in the art after reading the following detailed description of the preferred embodiment that is illustrated in the various figures and drawings.

DETAILED DESCRIPTION

Content of U.S. Pat. No. 12,356,141, US Application No. Ser. No. 19/007,580 and Application No. Ser. No. 19/303, 389 is incorporated herein by reference.

For heat dissipation, the present invention provides a heat dissipating structure, which comprises a duct and an airflow generating (AFG) device. The AFG device is actuated to generate air pulses toward or away from an opening of the duct at an ultrasonic pulse rate. These air pulses produce a net airflow in a single direction, thereby inducing airflow(s) within a channel formed in the duct. The duct is in contact with electronics (e.g., a memory module) and establishes a heat transfer path from the electronics to the surroundings.

To ensure significant airflow, the AFG device, which may comprise a modulating means and a demodulating means, is introduced. The modulating means generates an ultrasonic air pressure wave/variation (UAW) having an ultrasonic carrier frequency $f_{UC}$. The amplitude of the UAW is modulated according to an input signal $S_{IN}$. This amplitude modulated ultrasonic air pressure wave/variation (AMUAW) is then synchronously demodulated by the demodulating means, such that spectral components embedded in the AMUAW are shifted by integer multiples of the ultrasonic carrier frequency, $\pm n \cdot f_{UC}$, where n is a positive integer. As a result of this synchronous demodulation, spectral components of the AMUAW are partially transferred to the baseband. In this manner, the AFG device can be made compact while still creating significant airflow or air pressure to function as a (miniature) air pump or bladeless fan.

Figure 1:
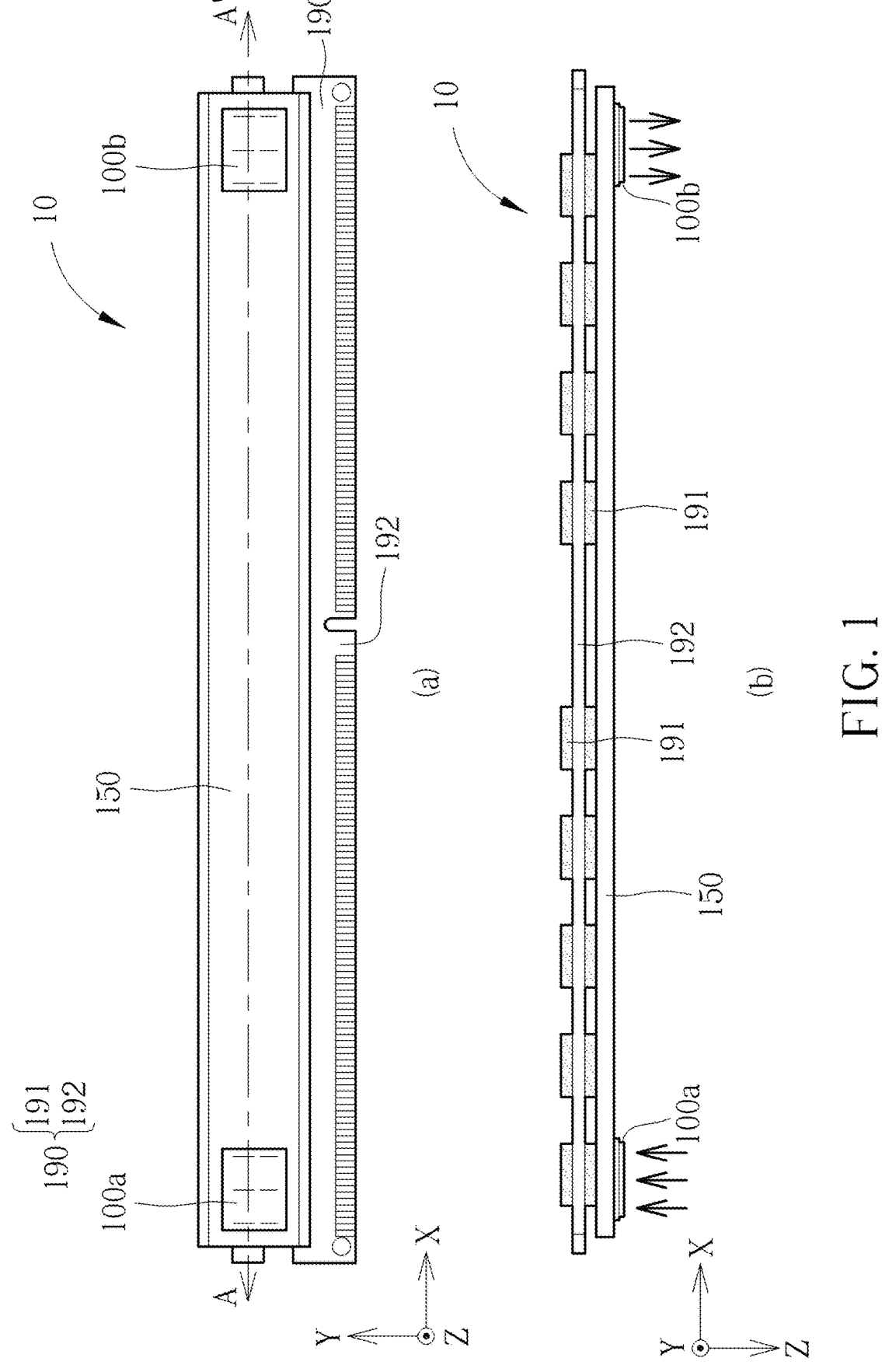
FIG. 1 to FIG. 3 are schematic diagrams of heat dissipating structures according to embodiments of the present invention.

For example, FIG. 1 (*a*) and (*b*) are top-view and side-view schematic diagrams of a heat dissipating structure 10, respectively. The heat dissipating structure 10 comprises AFG devices 100*a*, 100*b*, and a duct (or conduit) 150. The heat dissipating structure 10 is disposed adjacent to a memory module 190 (e.g., a Dual Inline Memory Module (DIMM)) to transfer heat away. The duct 150 may (or may not) be thermal conductive duct.

The AFG devices 100*a* and 100*b* may initiate airflows to facilitate heat transfer. Specifically, the AFG device 100*a* is actuated to generate air pulses toward a (first) opening of the duct 150 at an ultrasonic pulse rate. These air pulses produce a net (first) airflow constantly in a single direction (e.g., −Z). Similarly, the AFG device 100*b* is actuated to generate air pulses away from a (second) opening of the duct 150 at the ultrasonic pulse rate. These air pulses produce a net (second) airflow constantly in a single direction (e.g., +Z). The (first and second) airflows (e.g., 500*a*F and 500*b*F in FIG. 5) may induce a (third) airflow within a channel (e.g., 555 in FIG. 5) of the duct 150.

The duct 150 is hollowed to form the channel, such that the (third) airflow directed through the channel can cool the memory module 190. Specifically, the channel is connected to the AFG devices 100*a* and 100*b* via the (first and second) openings, respectively. The (first) airflow from the AFG device 100*a* flows through the (first) opening into the channel, introducing cold air (e.g., at ambient temperature) into the channel. The cold air then flows through the channel to absorb heat from memory chips 191 of the memory module 190. The heated air is subsequently drawn out of the channel by the AFG device 100*b* via the (second) opening, thereby forming the (second) airflow.

Figure 5:
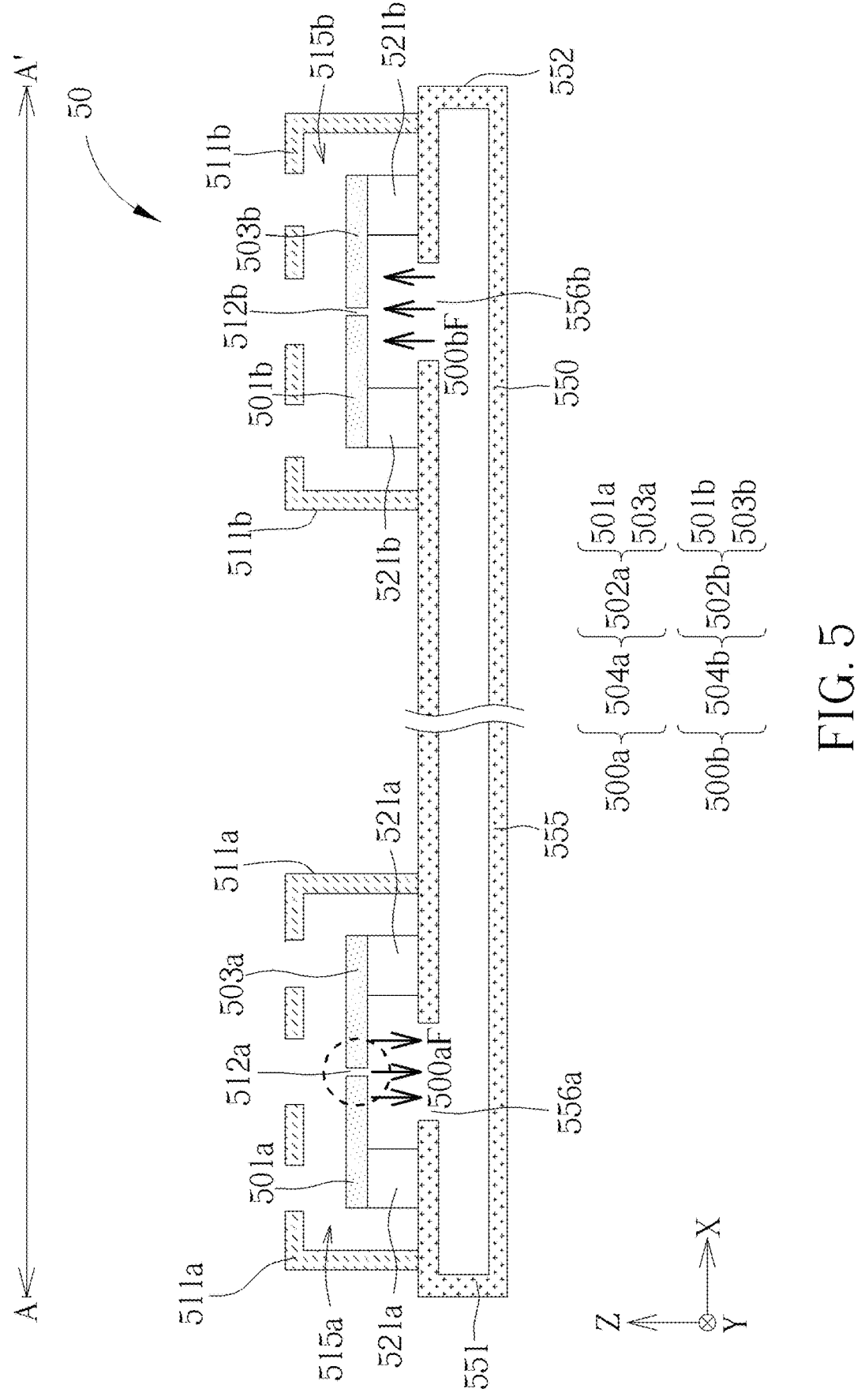
FIG. 5 and FIG. 6 are cross-sectional-view schematic diagrams of heat dissipating structures according to embodiments of the present invention.

FIG. 5 is a cross-sectional-view schematic diagram of a heat dissipating structure 50 according to an embodiment of the present invention. The cross section of the heat dissipating structure 50 may be taken along a cross-section line A-A' shown in FIG. 1.

The heat dissipating structures 10 and 50 may be implemented using similar mechanisms. For example, the AFG devices 500*a* and 500*b* are disposed directly on one surface of the duct 550, while the opposite surface of the duct 550 may be in contact with or in close proximity to heat source(s) (e.g., a printed circuit board (PCB) 192 or the memory chips 191 of the memory module 190). In this manner, cold air flowing through the duct 550 may be heated by the heat source(s), while the duct 550 and the AFG devices 500*a* and 500*b* direct the heated air away from the heat source(s).

To facilitate heat dissipation, the duct 550 may be made of thermally conductive materials (e.g., copper, aluminum, pyrolytic graphite, or graphene). Thermal interface material(s) may be used to eliminate air gaps between the duct 550 and the heat source(s).

The duct 550 may be a long tube, compared to the relatively small AFG devices 500*a* or 500*b* (e.g., 10-15 millimeters in length, 10-15 millimeters in width, and 2-3 millimeters in thickness). The size of the AFG devices 500*a* or 500*b* may be smaller than or equal to that of one heat source. The duct 550 may completely overlap the heat source(s) to increase the heat transfer area through which heat can be exchanged.

Geometric features of the duct 550 may be associated with the AFG devices 500*a* and 500*b*. For example, the channel 555 formed within the duct 550 comprises openings 556*a* and 556*b* for the AFG devices 500*a* and 500*b*. Apart from the openings 556*a* and 556*b*, the duct 550 has a closed, hollow structure. Ends 551 and 552 of the duct 550 may be designed to be closed because the AFG devices 500*a* and 500*b* are positioned near those ends 551 and 552. As the ends 551 and 552 are closed, air pushed or pulled by the AFG device 500*a* or 500*b* flows into or out of the channel 555 mainly through the openings 556*a* and 556*b*. This push-pull configuration may facilitate heat dissipation. However, the present invention is not limited thereto, and the duct 550 may alternatively be open at its end 551 or 552.

The AFG device 500*a*, disposed directly on the duct 550 at a position corresponding to the opening 556*a*, comprises a film structure 504*a* (e.g., a membrane or diaphragm). The film structure 504*a* comprises flaps 501*a* and 503*a* positioned opposite to each other. The operating principle of the AFG device 500*a* is similar to those disclosed in U.S. Pat. Nos. 11,943,585 B2, 12,317,034 B2 and application No. Ser. No. 18/624,105, which are incorporated herein by reference. The flaps 501*a* and 503*a*, constituting a flap pair 502*a*, are actuated to perform a common-mode movement to form an AMUAW with an ultrasonic carrier frequency $f_{UC}$ (e.g., 192 or 96 kHz), which can be regarded as a modulation operation. Meanwhile, the flaps 501*a* and 503*a* are also actuated to perform a differential-mode movement to form an opening or a virtual valve (VV), at an ultrasonic opening rate (e.g., 192 or 96 kHz), which can be regarded a demodulation operation.

A slit 512*a* is formed between the flaps 501*a* and 503*a*, and the opening or the VV is created as a result of the slit 512*a*. In the present invention, the terms "slit", "opening", and "VV" share the same notation (e.g., 512*a*) as they share the same physical location and express similar concept in different aspects. The VV 512*a* is to emphasize its capability of being controlled to be opened or closed, while the opening 512*a* is to highlight its status especially when it is opened. By actuating the flaps 501*a* and 503*a*, the distance between free ends of the flaps 501*a* and 503*a* increases and the opening 512*a* or the VV 512*a* is formed.

Figure 10:
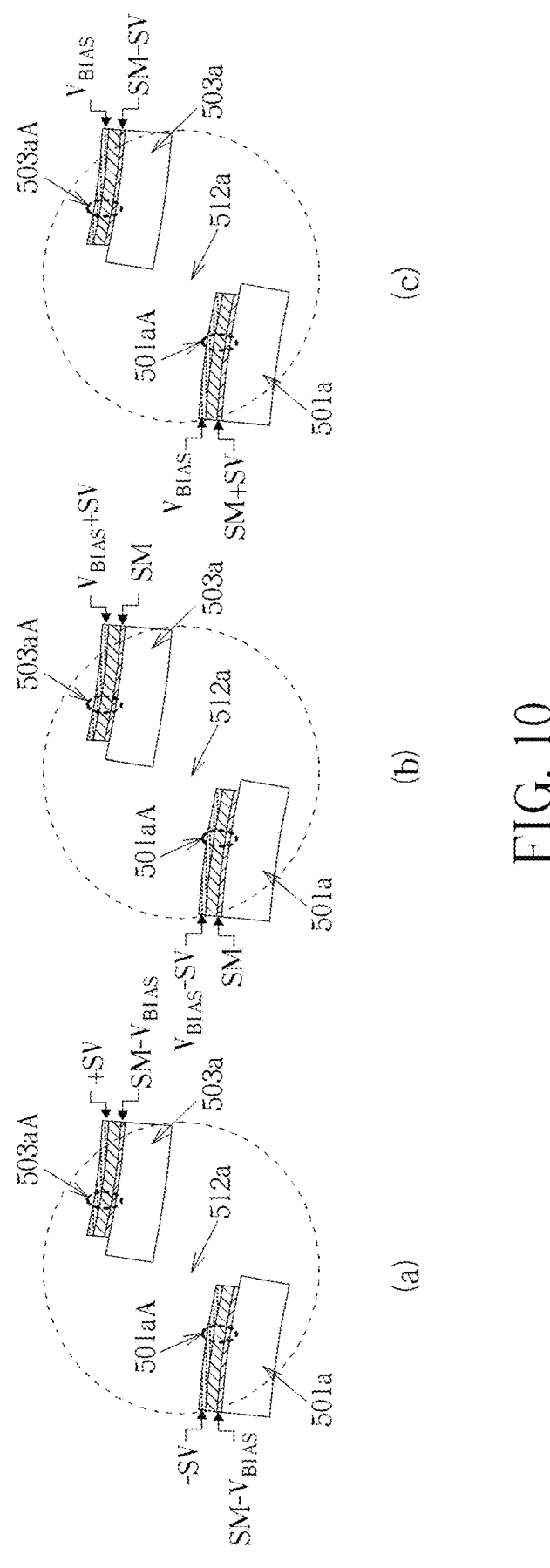
FIG. 10 illustrates schematic diagrams of wiring schemes for the AFG device shown in FIG. 5.

In the present invention, "the flaps 501*a* and 503*a* performing the common-mode movement" means that the flaps 501*a* and 503*a* are actuated to move in a common direction or actuated by a common driving signal (e.g., a modulation signal SM shown in FIG. 10). Besides, "the flaps 501*a* and 503*a* performing the differential-mode movement" means that the flaps 501*a* and 503*a* are actuated to move/bend in different/opposite directions with respect to a common reference position or actuated by a differential pair of driving signals (e.g., demodulation signals +SV and −SV shown in FIG. 10, but not limited thereto).

As the differential-mode movement (demodulation) and the common-mode movement (modulation) are simultaneously performed by the flap pair 502*a*, the in-situ and concurrent modulation-and-demodulation can be achieved through particular wiring schemes. For example, as shown in FIG. 10, the AFG device 500*a* may comprise an actuator 501*a*A disposed on the flap 501*a* and an actuator 503*a*A disposed on the flap 503*a*. Each actuator (e.g., 501*a*A or 503*a*A) comprises a top electrode and a bottom electrode. For example, FIG. 10 (*a*), (*b*), and (*c*) illustrate details of a circled region marked with dashed lines shown in FIG. 5, respectively. As shown in FIG. 10 (*a*) and (*b*), the bottom electrode of the actuator 501*a*A or 503*a*A receives the modulation signal SM, and the top electrode of the actuator 501*a*A or 503*a*A receives the demodulation signals +SV and −SV, which have opposite polarities. A suitable bias voltage $V_{BIAS}$ may be applied to either the bottom electrode shown in FIG. 10 (*a*) or the top electrode shown in FIG. 10 (*b*). As shown in FIG. 10 (*c*), one electrode of the actuator 501*a*A or 503*a*A receives both the modulation signal SM and the demodulation signal +SV or −SV (but not limited thereto), while the other electrode is properly biased.

Figure 11:
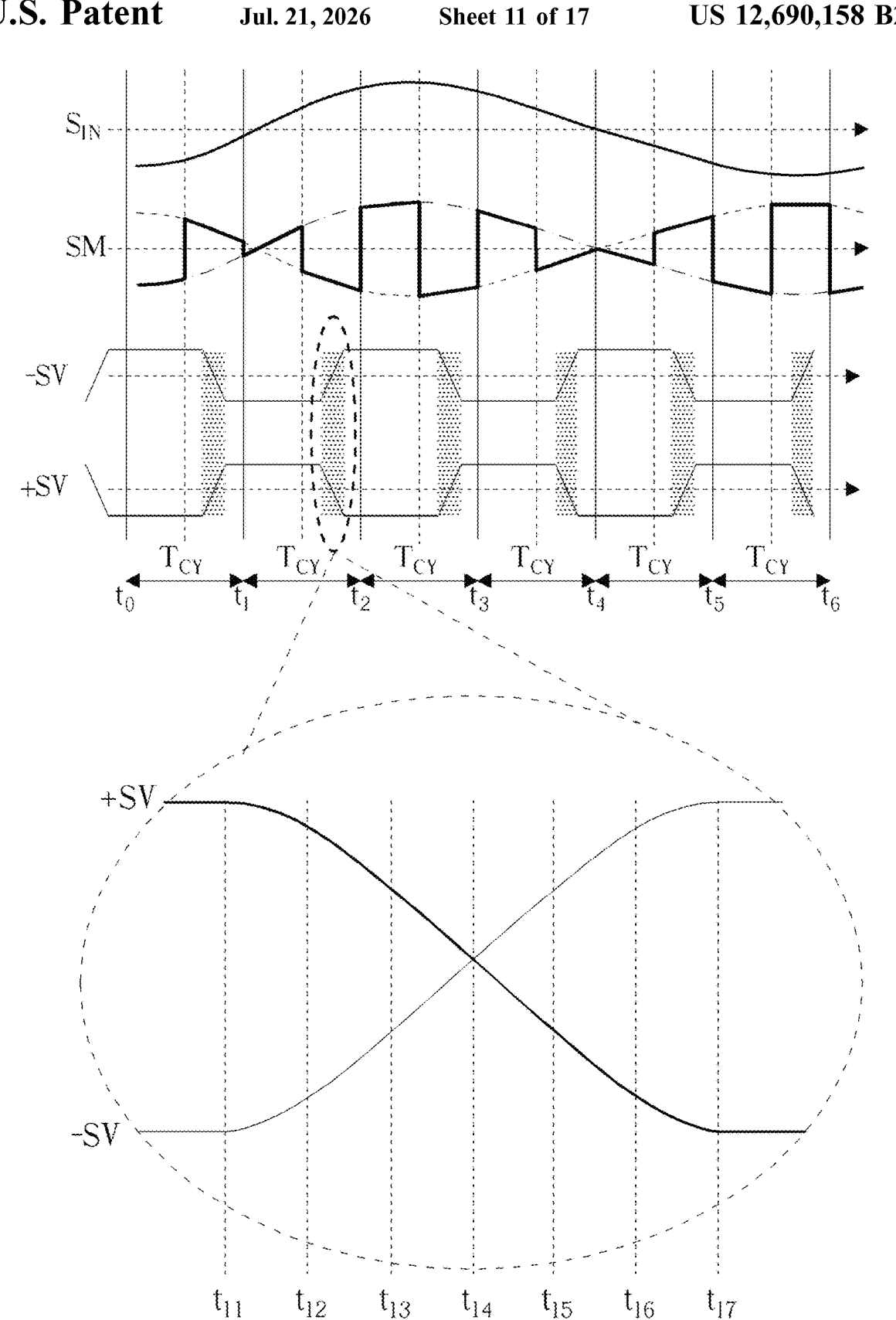
FIG. 11 is a schematic diagram of waveforms of a modulation signal and demodulation signals for the AFG device shown in FIG. 5.

The waveforms of the modulation signal SM and the demodulation signals ±SV may be referred to FIG. 11 (or similar to those shown in FIG. 11). In an embodiment shown in FIG. 11, the demodulation frequency (96 kHz) of the demodulation signals ±SV may be a half the modulation frequency (e.g., 192 kHz) of the modulation signal SM. Specifically, the polarity of pulses in the modulation signal SM with respect to a constant voltage alternates/toggles twice in one operating cycle time $T_{CY}$. At a specific time, given that the demodulation signal +SV comprises a first pulse with a first polarity relative to a constant/average voltage, and the demodulation signal −SV comprises a second pulse with a second polarity relative to the constant/average voltage, the first and second polarities are opposite, but the first and second pulses may have equal amplitude. The polarities of pulses in the demodulation signal +SV or −SV with respect to the constant/average voltage alternates/toggles once in one operating cycle time $T_{CY}$. Consequently, the flaps 501a and 503a form the opening 512a at an ultrasonic opening rate of 192 kHz, and the AFG device 500a produces air pulses at an ultrasonic pulse rate $f_{Pulse}$ of 192 kHz. The operating cycle time $T_{CY}$ of the ultrasonic carrier frequency $f_{UC}$ may be the reciprocal of the ultrasonic pulse rate $f_{Pulse}$, namely, $T_{CY}=1/f_{Pulse}$.

In practice, the differential-mode movement (demodulation) and the common-mode movement (modulation) may not occur in time-divisional fashion. Instead, at a given time instant, the common mode displacement and the differential mode displacement may be combined to produce a net movement of the flap 501a or 503a through the aforementioned wiring schemes. For example, FIG. 12 illustrates a (symmetric movement) embodiment of the flap pair 502a at time instants $t_{11}$ to $t_{17}$, and the bottom corner of FIG. 11 illustrates an enlarged view of the top corner of FIG. 11 for those time instants $t_{11}$ to $t_{17}$.

Figure 12:
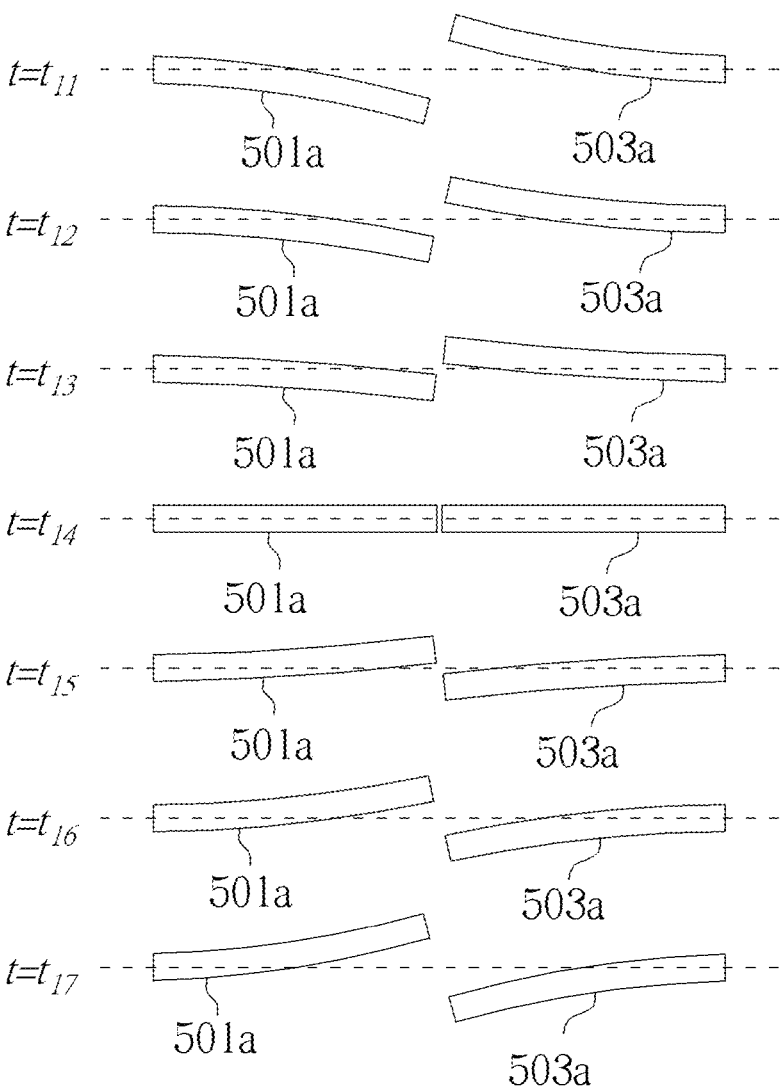
FIG. 12 is a schematic diagram of slow motion of the differential-mode movement and the common-mode movement of the AFG device shown in FIG. 5.

In FIG. 12, from the time instants $t_{14}$ to $t_{17}$, the flap 501a moves upward and the flap 503a moves downward, such that the VV 512a is considered to be in "opened" state (i.e., the opening 512a is formed) at the time instant $t_{17}$ (and remains open thereafter). Similarly, the opening 512a is present in the flap pair 502a at the time instant $t_{11}$ (and before). The common-mode movement of the flaps 501a and 503a during this time period of $t_{14}$-$t_{17}$ (or at the time instant $t_{11}$) is effectively "made to vanish".

In FIG. 12, from the time instants $t_{11}$ to $t_{14}$, the flap 501a moves downward and the flap 503a moves upward, such that the VV 512a is considered to be in "closed" state, meaning that the flaps 501a and 503a can be treated as a continuous membrane within this time period of $t_{11}$-$t_{14}$ and behave like one (complete membrane) in terms of membrane movement. When the VV 512a is in the "closed" state, the displacement difference between the free ends of the flaps 501a and 503a is less than (or equal to) the thickness of the film structure 504a.

The "closed" state of the VV 512a occurs during transitions of the differential-mode movement of the flaps 501a and 503a. Specifically, in a (first) transition time (e.g., $t_{11}$-$t_{17}$), the flap 501a, driven by the demodulation signal +SV, transitions from upward to downward motion; in a (second) transition time (e.g., $t_{11}$-$t_{17}$), the flap 503a, driven by the demodulation signal −SV, transitions from downward to upward motion. In other words, the VV 512a remains closed during a subinterval (e.g., $t_{13}$-$t_{15}$) within the transition times (e.g., $t_{11}$-$t_{17}$) of the flaps 501a and 503a or within the transition times (e.g., $t_{11}$-$t_{17}$) of the demodulation signals −SV and +SV—namely, the flaps 501a and 503a moving in opposite directions and the demodulation signals −SV and +SV increasing/decreasing oppositely. In short, when the VV 512a is closed, the flaps 501a and 503a are in motion.

The direction of a net airflow 500aF may be controlled by adjusting the phase between the modulation signal SM and the demodulation signal ±SV. For example, in FIG. 12, the first transition time $t_{11}$-$t_{17}$ of the demodulation signal +SV occurs when the modulation signal SM is low. In this case, the AFG device 500a may produce the airflow 500aF in one direction. When the demodulation signal ±SV is shifted such that the transition time of the demodulation signal ±SV coincides with the time interval during which the modulation signal SM is high, the AFG device 500a may instead produce the airflow 500aF in the opposite direction.

Figure 13:
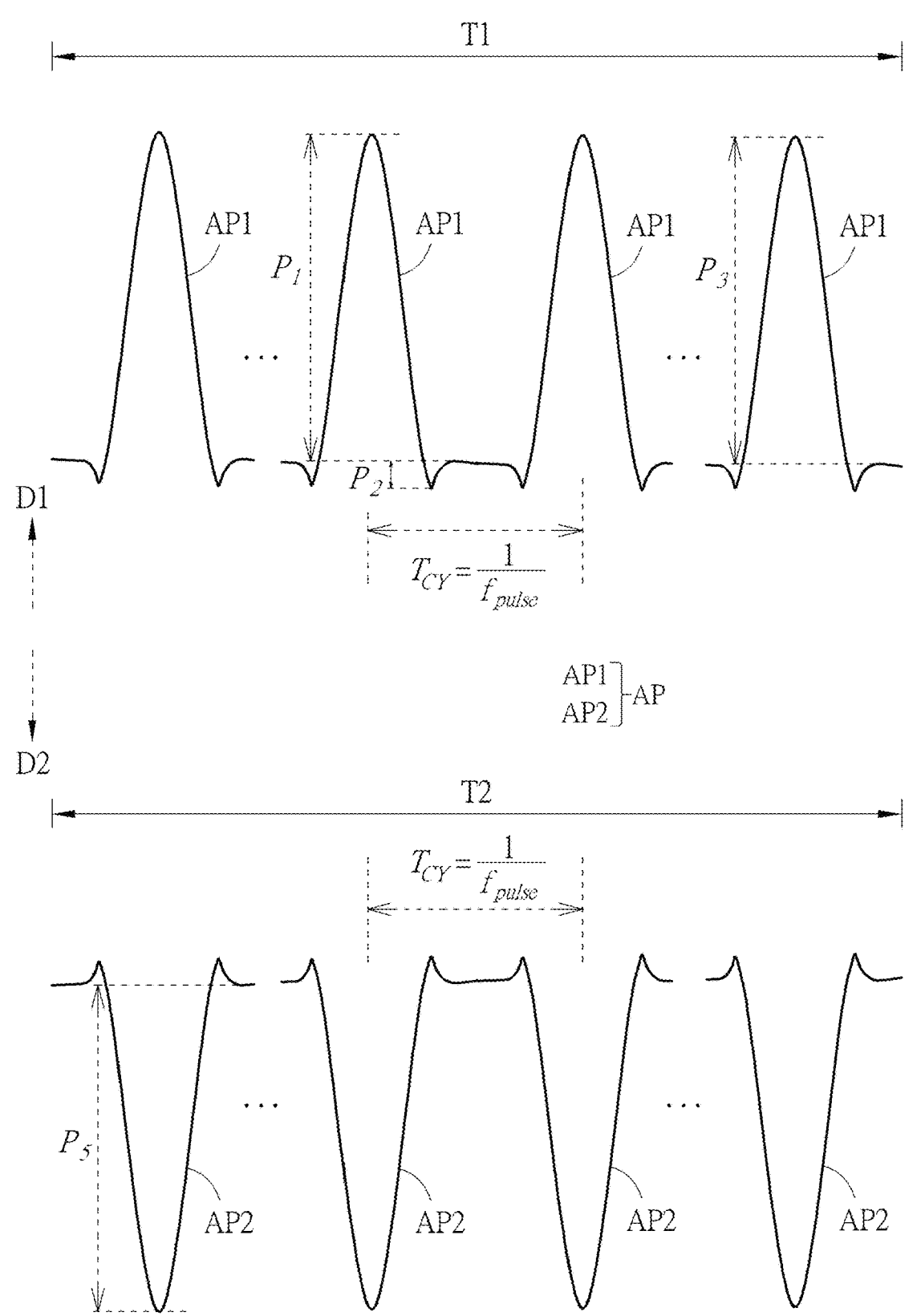
FIG. 13 is a schematic diagram of air pulses according to an embodiment of the present invention.

Alternatively, the direction of the net airflow 500aF may be dependent on the modulation signal SM. Specifically, the modulation signal SM may be generated according to the input signal $S_{IN}$, which may comprise alternating current (AC) component or a nonzero direct current (DC) voltage/offset. The polarity of the DC offset may be related to the direction of the net airflow 500aF. For example, FIG. 13 is a schematic diagram of air pulses AP according to an embodiment of the present invention. During a time interval T1, air pulses AP1 generated by the AFG device 500a may produce a (first) net airflow constantly in a (first) direction D1 in response to the DC offset being positive. On the other hand, during a time interval T2, air pulses AP2 generated by the AFG device 500a may produce a second net airflow constantly in a second direction D2, which is opposite to the first direction D1, in response to the DC offset being negative.

In other words, the AFG device 500a may produce a unidirectional net airflow (e.g., 500aF). Alternatively, the AFG device 500a may switch the direction of its airflow 500aF. However, the time interval T1 or T2 (e.g., 0.5 second) is longer than the operating cycle time $T_{CY}$ or the reciprocal of the minimum audible frequency (e.g., 10 Hz), and hence the (first or second) net airflow produced by the air pulses AP1 or AP2 may be considered as constantly in a single direction D1 or D2.

The strength of the net airflow 500aF is controllable. Specifically, the strength of the net airflow 500aF may be influenced by the magnitude of the modulation signal SM. For example, the strength of the net airflow 500aF may be a function of the DC offset. The strength of the net airflow 500aF may be determined by the amplitude (e.g., a peak value $p_1$, $p_3$, or $p_5$ in FIG. 13) of an individual air pulse (e.g., AP1 or AP2). The amplitudes of the air pulses AP1 or AP2 may vary from pulse to pulse or remain consistent across pulses.

In FIG. 13, an air pulse (e.g., AP1 or AP2) within one operating cycle time $T_{CY}$ is asymmetric. The degree of asymmetry may be evaluated by the ratio of $p_2$ to $p_1$, where $p_1 > p_2$. Here, $p_1$ represents the peak value of a first half-cycle pulse with a first polarity relative to a reference level, and $p_2$ represents the peak value of a second half-cycle pulse with a second polarity relative to the reference level. This reference level may be corresponding to ambient condition (e.g., ambient pressure or zero airflow).

The asymmetry of an air pulse (e.g., AP1 or AP2) may indicate the presence of low frequency component(s) of the air pulses AP1 or AP2 generated by the AFG device 500a. The greater the asymmetric is, the stronger the baseband spectral component(s) of the air pulses AP1 or AP2 will be.

The AFG device 500a may be able to produce the asymmetric air pulses AP1 or AP2 by aligning the opening timing of the VV 512*a* (in response to the demodulation signal ±SV) with the timing of acceleration of the common-mode movement of the flaps 501*a* and 503*a* (in response to the modulation-driving signal SM). Specifically, it is the demodulation operation of the AFG device 500*a* that converts the symmetric UAW, which is produced through the modulation operation, into asymmetric air pulses (e.g., AP1 or AP2). When the "opened" period of the VV 512*a* overlaps a time interval of one of the two polarities of acceleration of common-mode flap movement, the AFG device 500*a* shall produce single-ended (SE) or SE-like air pulses. Therefore, as shown in FIG. 12, the transition time of the demodulation signal ±SV may not coincide with the transition time of the modulation signal SM. In a word, pulse asymmetry relies on proper timing of opening the VV 512*a*.

The opening of the VV 512*a* does not determine the strength of the air pulses AP1 or AP2, but influences how strong the "near net-zero pressure" effect is. When the opening of the VV 512*a* is wide, the "net-zero pressure" effect becomes more pronounced, the auto-neutralization is complete, and the asymmetry is more obvious, resulting in a significant baseband signal.

The AFG device 500*a* may be configured/constructed using different techniques, depending on the application requirements. In FIG. 5, a chamber 515*a* is defined between a cap structure 511*a* and the film structure 504*a*. The film structure 504*a*, supported by a supporting structure 521*a*, may be fabricated using a MEMS (Micro Electro Mechanical Systems) fabrication process. A silicon (Si) substrate with a thickness of 250-500 micrometers may be etched to form the supporting structure 521*a*. On the top of this Si substrate, a thin layer, typically 3-6 micrometers in thickness, made of silicon on insulator (SOI) or POLY on insulator (POI), may be etched to form the flaps 501*a* and 503*a*. A layer of piezoelectric material, such as lead zirconate titanate (PZT), may be deposited atop the flap pair 502*a* to form the actuators 501*a*A and 503*a*A.

Figure 2:
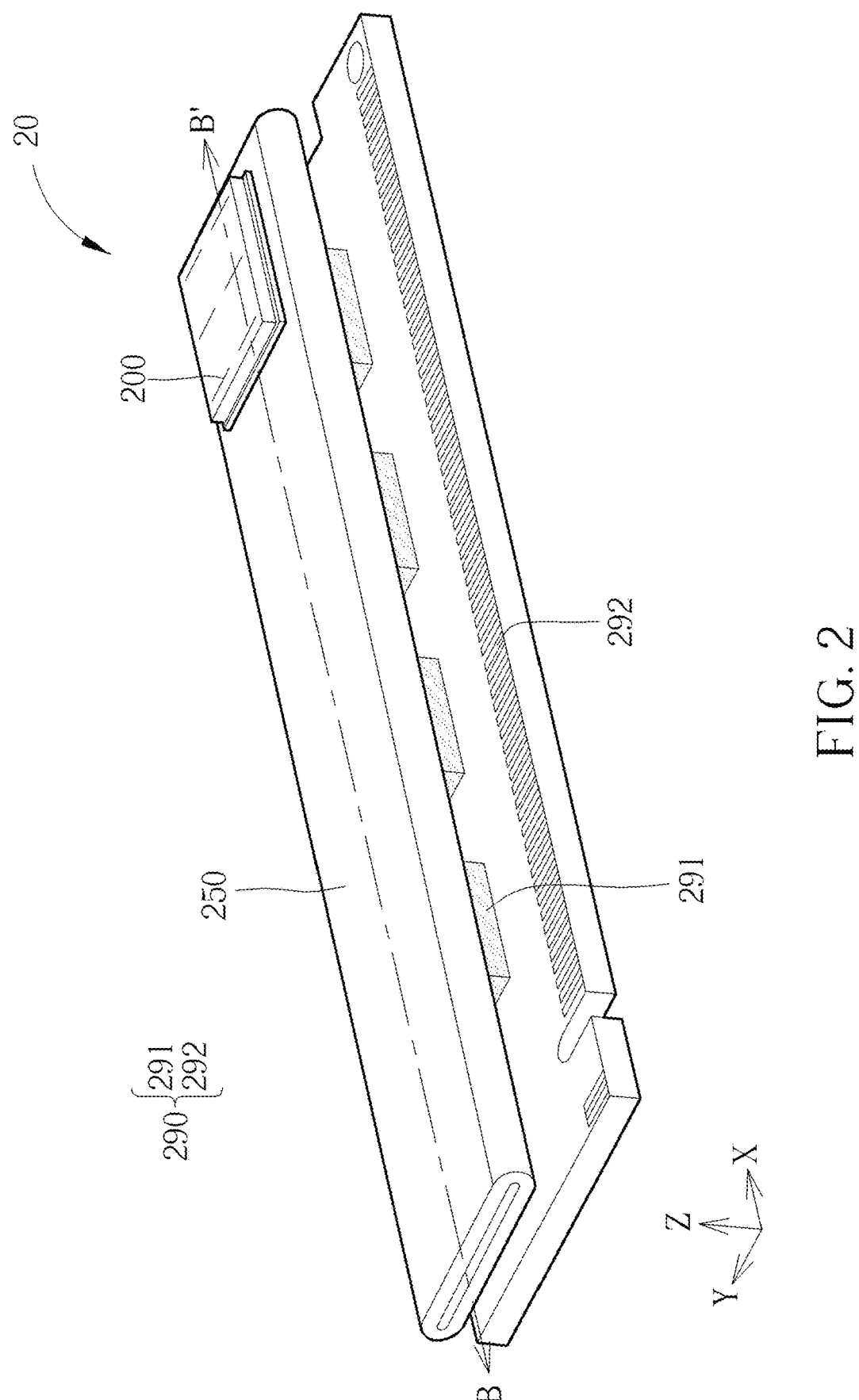

The number of AFG device(s) may be adjusted for different scenarios. For example, FIG. 2 is a schematic diagram of a heat dissipating structure 20 according to an embodiment of the present invention. The heat dissipating structure 20 may comprise only one AFG device 200, positioned substantially near one end of a duct 250 of the heat dissipating structure 20. The number (i.e., 1) of AFG device 200 is less than the number (i.e., 4) of memory chips 291 of a memory module 290.

Even a single AFG device (i.e., 200) helps remove excess heat from the memory chips 291. Specifically, the AFG device 200 is actuated to generate air pulses, which may produce a net airflow (e.g., 600*b*F) continuously in the direction −Z or +Z. Accordingly, AFG device 200 may pull cold air into the duct 250 or push hot air out of the duct 250. As a result, the AFG device 200, disposed directly on the duct 250, may move heated air within the duct 250.

Figure 6:
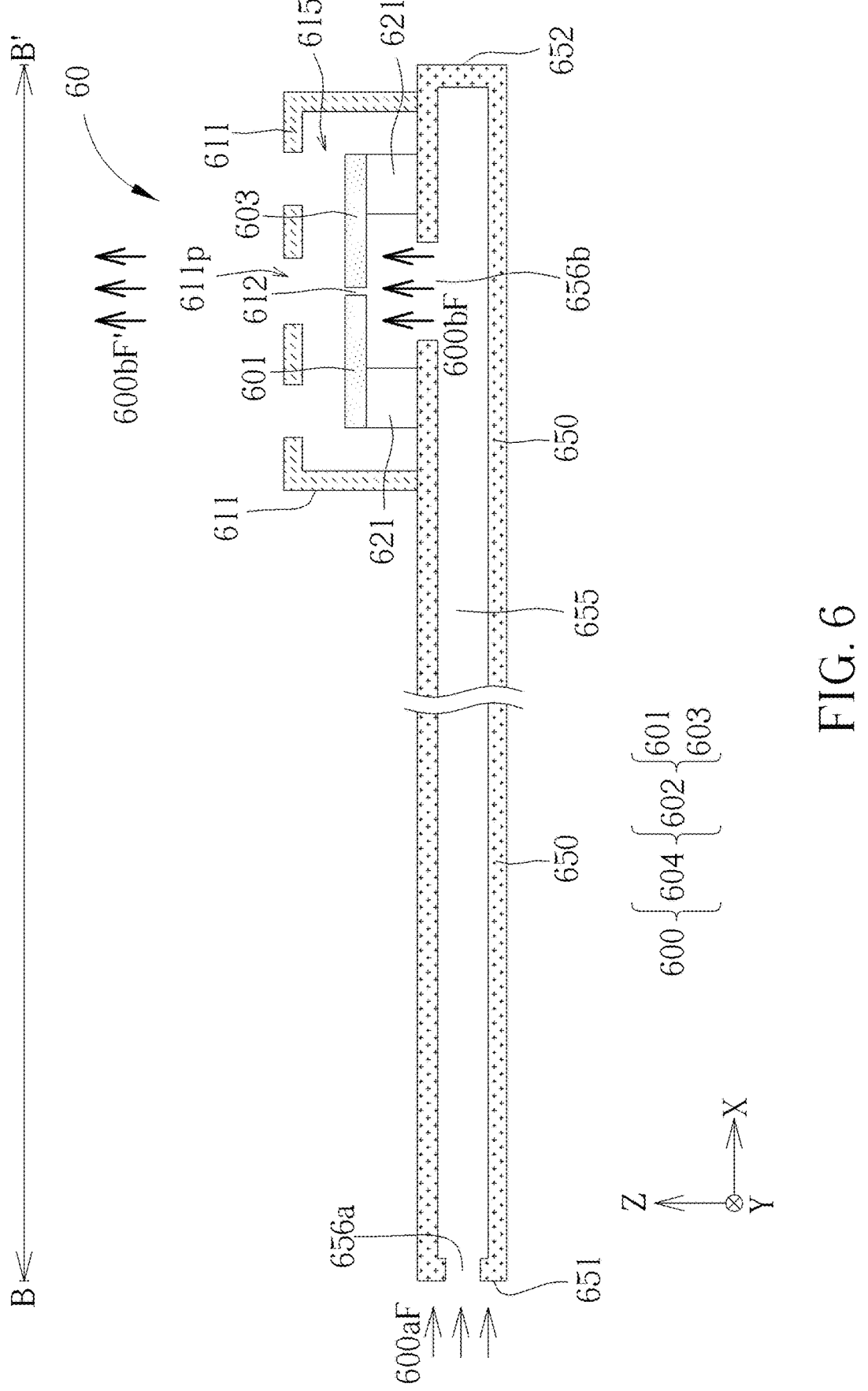

FIG. 6 is a cross-sectional-view schematic diagram of a heat dissipating structure 60 according to an embodiment of the present invention. The cross section of a heat dissipating structure 60 may be taken along a cross-section line B-B' shown in FIG. 2. An AFG device 600 or a duct 650 of the heat dissipating structure 60 may be used to implement the AFG device 200 or the duct 250.

A channel 655 formed in the duct 650 has openings 656*a* and 656*b* to create an airflow path. The channel 655 is connected to the AFG device 600 via the opening 656*b*, such that a net airflow 600*b*F driven by the AFG device 600 may flow out of (or into) the channel 655 through the opening 656*b*. Because the AFG device 600 is positioned near an end

652 of the duct 650, the end 652 and the opposite end 651 of the duct 650 may be designed to be closed and open, respectively. Corresponding to the airflow 600*b*F, an airflow 600*a*F may flow into (or out of) the channel 655 through the opening 656*a* near the end 651.

The position of an AFG device may be adjusted for different scenarios. For example, FIG. 3 (*a*) and (*b*) are schematic diagrams of a heat dissipating structure 30, respectively. The heat dissipating structure 30 may comprise only one AFG device 300, positioned substantially near the center of a duct 350 of the heat dissipating structure 30, to establish a center-pull configuration.

The center-pull configuration may induce airflows in different directions within the duct 350. For example, to exhaust hot air from the duct 350, the AFG device 300 generates air pulses that may produce a net airflow constantly in the direction +Z. This net airflow forms an airflow 300*b*F', directed substantially in the direction +Z from the AFG device 300 into the surroundings, and creates local low pressure inside the duct 350. This low pressure further draws cold ambient air through from openings 356*a* and 356*b*, which are located at opposite ends 351 and 352 of the duct 350, to form airflows 300*a*F and 300*c*F. Accordingly, air within the duct 350 may travel substantially in the directions +X and −X over a channel of the duct 350 to absorb heat from memory chips 391 of a memory module 390.

Figure 3:
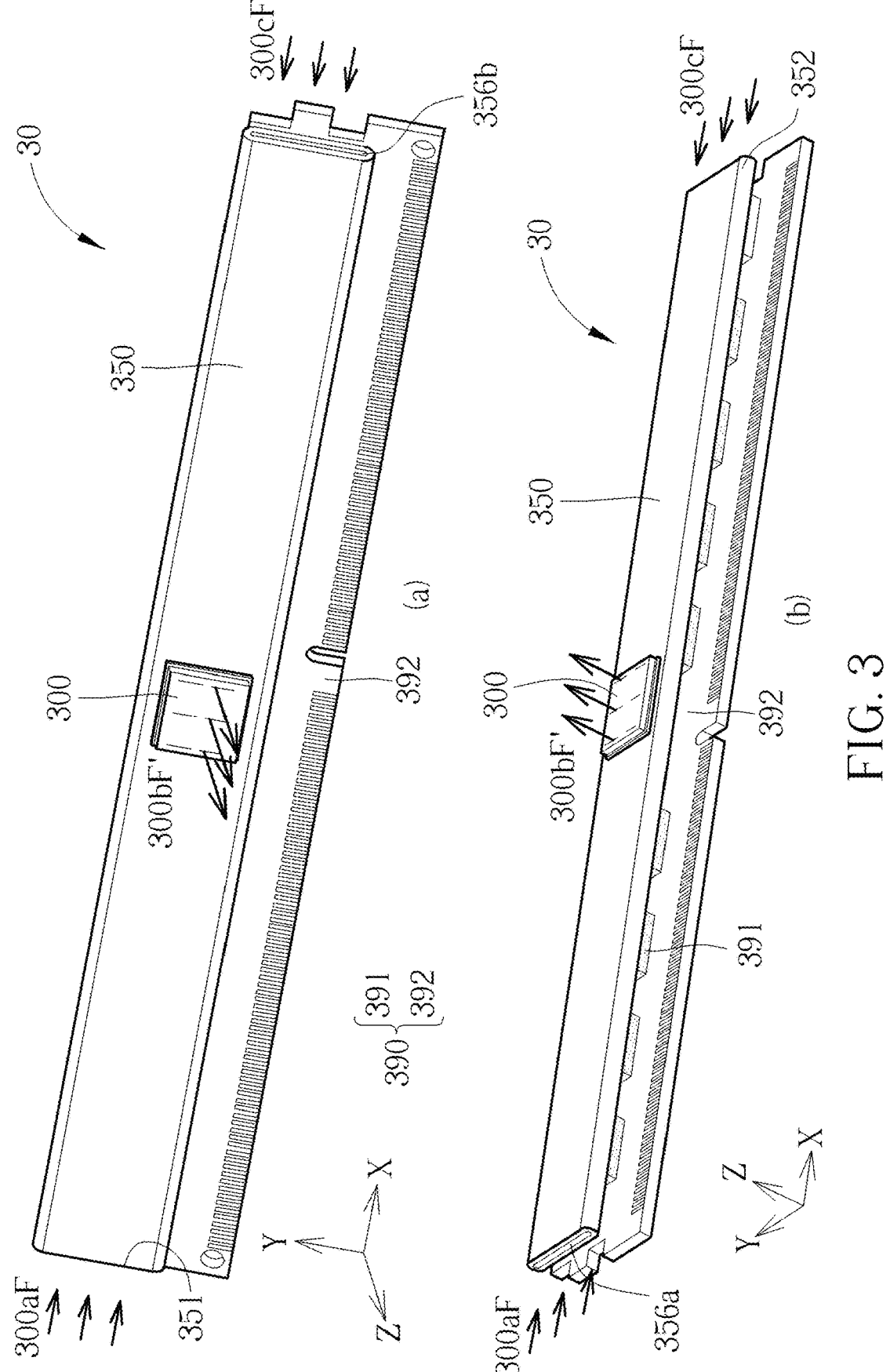

In FIG. 3, the AFG device 300 is top-firing, meaning that a cap structure (e.g., 611 in FIG. 3) of the AFG device 300 has an opening (e.g., 611*p* in FIG. 3) formed on the top of the cap structure. The top-firing AFG device 300 produces the net airflow in the direction +Z or −Z, in which flaps of the AFG device 300 substantially move. In another embodiment, an AFG device may be side-firing, meaning that a cap structure of the AFG device has an opening is formed on a sidewall of the cap structure.

Figure 7:
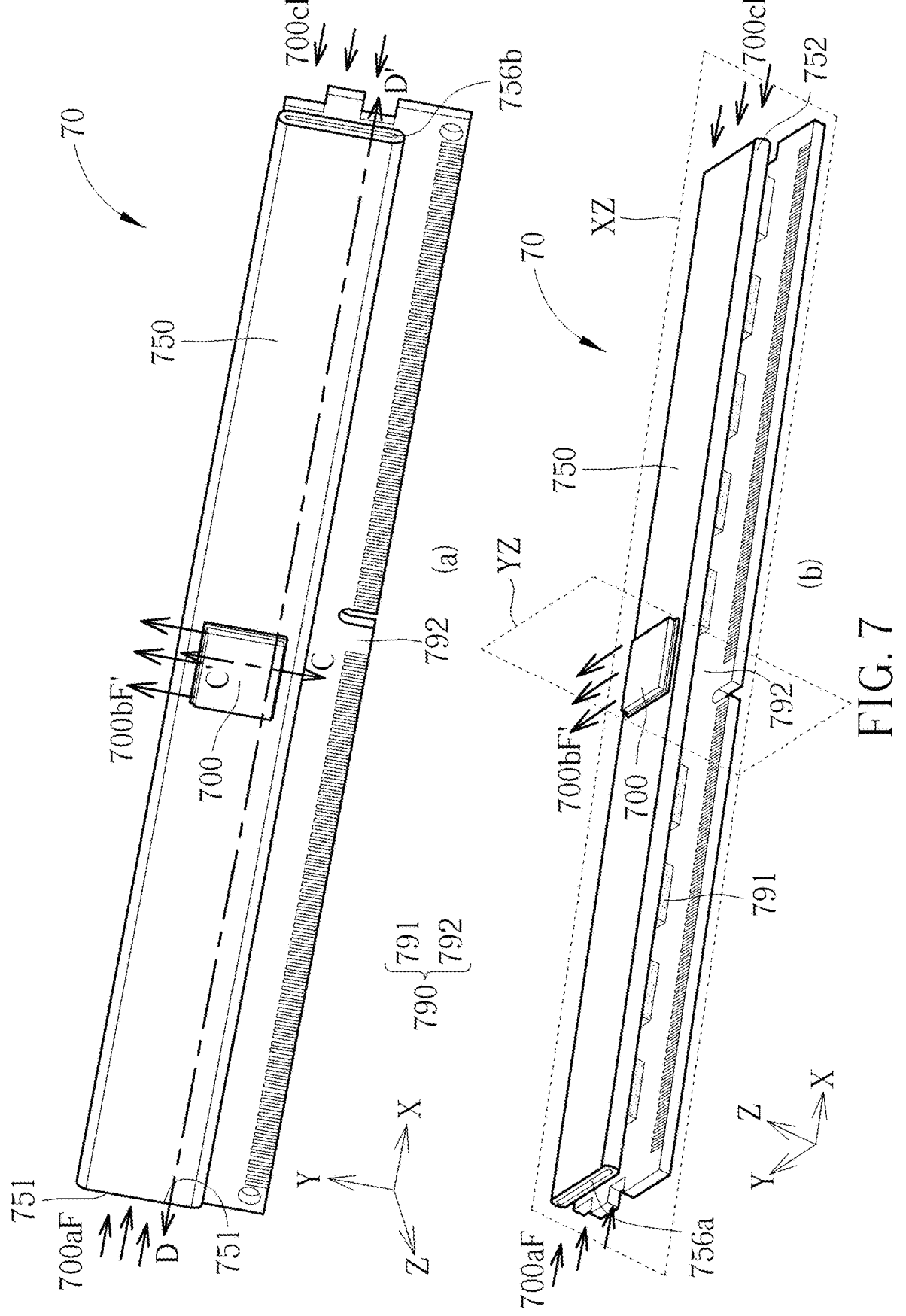
FIG. 7 is a schematic diagram of a heat dissipating structure according to an embodiment of the present invention.
Figure 8:
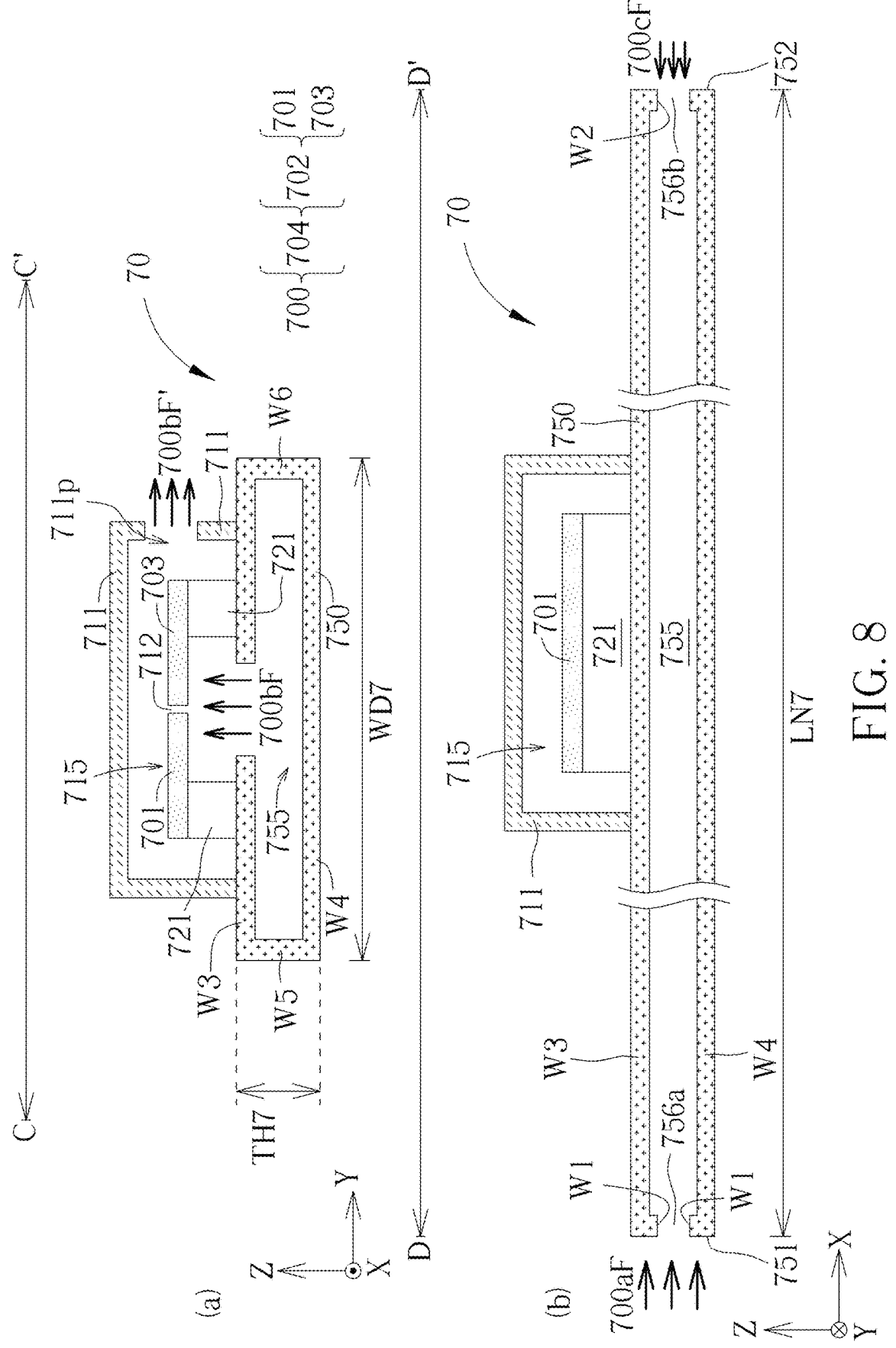
FIG. 8 is cross-sectional-view schematic diagrams of the heat dissipating structure shown in FIG. 7.

For example, FIG. 7 (*a*) and (*b*) are schematic diagrams of a heat dissipating structure 70, respectively. FIG. 8 (*a*) and (*b*) are cross-sectional-view schematic diagrams of the heat dissipating structure 70 taken along cross-section lines C-C' and D-D' shown in FIG. 7, respectively. The heat dissipating structure 70 may comprise an AFG device 700, which is side-firing, and a duct 750.

Like the top-firing AFG device 300 shown in FIG. 3, in FIG. 7, the direction of an airflow 700*b*F' from the side-firing AFG device 700 to the surroundings is perpendicular to that of an airflow 700*a*F or 700*c*F from an opening 756*a* or 756*b* of the duct 750. For example, the AFG device 700 generates air pulses that may produce a net airflow 700*b*F constantly in the direction +Z. This net airflow 700*b*F forms the airflow 700*b*F', directed substantially in the direction +Y from the AFG device 700 to the surroundings. Local low pressure inside the AFG device 700, caused by the net airflow 700*b*F, draws hot air from the duct 750 into the AFG device 700. As a result, cold ambient air is forced into the duct 750 through the openings 756*a* and 756*b* to form the airflow 700*a*F or 700*c*F substantially in the direction ±X, which is perpendicular to both the directions +Z and +Y.

In FIG. 8, the duct 750 has walls W1-W6 with approximately uniform thickness, but is not limited thereto. For example, the wall W3 may be thicker than the wall W4; alternatively, the wall W1 or W2 may be thinner than the wall W5 or W6.

In FIG. 8, the length LN7 of the duct 750 in the direction X is greater than its width WD7 in the direction Y or its thickness TH7 in the direction Z. The direction ±X is the direction in which memory chips 791 are aligned to form an array, and the direction ±Z is the main direction of the movement of flaps 701 and 703 of the AFG device 700. The direction ±X, from which airflows 700aF and 700bF flow out through the opening 756a and 756b, is perpendicular to the direction +Y, from which the airflows 700bF' may flow out through an opening 711p of the AFG device 700.

Optionally, the length LN7, the width WD7, or the thickness TH7 is substantially different from a multiple of the wavelength $\lambda_{UC}$ corresponding to the ultrasonic carrier frequency $f_{UC}$, an odd multiple of half the wavelength $\lambda_{UC}$, or an odd multiple of one-quarter of the wavelength $\lambda_{UC}$. Optionally, a slit 712 between the flaps 701 and 703 positioned so as not to align with antinode(s) or node(s) of the resonance of the duct 750. Optionally, a film structure 704 of the AFG device 700, when not actuated (or in the "closed" state), is symmetrical with respect to a symmetry plane XZ or YZ of the duct 750.

Figure 4:
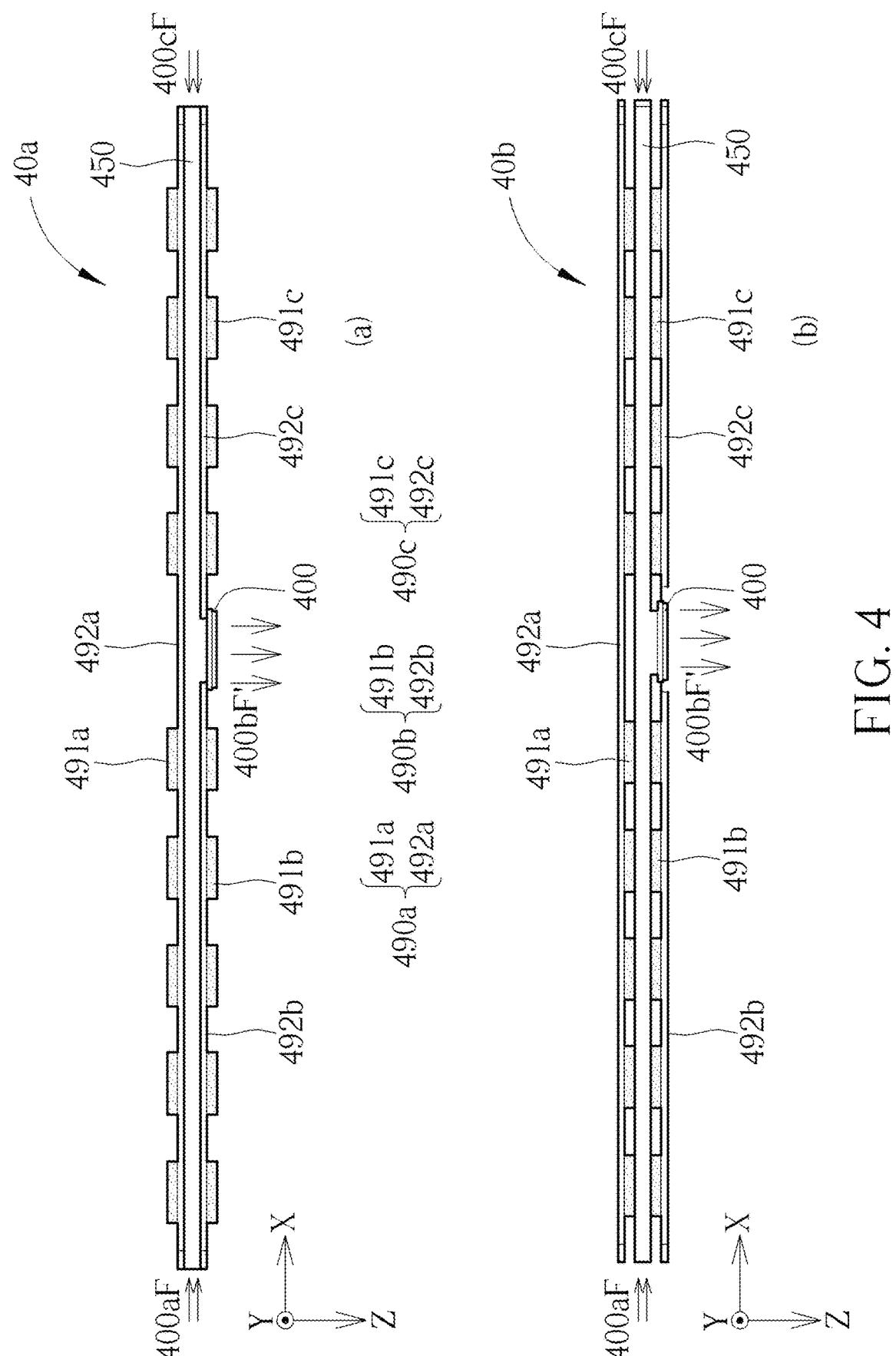
FIG. 4 illustrates side-view schematic diagrams of heat dissipating structures according to embodiments of the present invention.

One heat dissipating structure may be disposed next to more than one memory module. For example, FIG. 4 (a) and (b) are side-view sectional schematic diagrams of heat dissipating structures 40a and 40b according to embodiments of the present invention. A duct 450 of the heat dissipating structure 40a or 40b is positioned between two memory modules 490a, 490b, or 490c that are opposite to each other. An AFG device 400 of the heat dissipating structure 40a or 40b is positioned between two adjacent memory chips 491b and 491c on the memory modules 490b and 490c. A surface of the duct 450 may contact a PCB 492a, 492b, or 492c (as shown in FIG. 4 (a)) or memory chips 491a, 491b, or 491c (as shown in FIG. 4 (b)).

One memory module may be disposed next to more than one heat dissipating structure. For example, FIG. 9 (a) is a side-view schematic diagram of heat dissipating structures 90a and 90c according to an embodiment of the present invention. A memory module 990 may be sandwiched between the heat dissipating structures 90a and 90c.

The AFG device(s) (e.g., 900a and 900c) in a certain configuration may add even more airflow to the memory module 990 based on principles of fluid mechanics. For example, an airflow 900aF', induced by air pulses from the AFG device 900a of the heat dissipating structure 90a and directed constantly in the direction +Z, may pull air from behind and entrain air alongside; similarly, an airflow 900cF', induced by air pulses from the AFG device 900c of the heat dissipating structure 90c and also directed constantly in the direction +Z, may push air in front and entrain air alongside. In other words, the airflows 900aF' and 900cF' may induce an airflow 900eF in the direction +Z, which further cools the area surrounding the memory module 990. Likewise, airflows 900bF' and 900dF', generated by AFG device 900b of the heat dissipating structure 90a and the AFG device 900d of the heat dissipating structure 90c, may induce an airflow 900fF in the direction −Z. The induced airflows 900eF and 900fF help dissipate heat.

The configuration of AFG device(s) and a duct may be modified depending on the application scenario. For example, FIG. 9 (b) is a side-view schematic diagram of a heat dissipating structure 90g according to an embodiment of the present invention.

A duct 950g and AFG devices 900g, 900h, and 900i of the heat dissipating structure 90g are mutually influential and closely interconnected. For example, whether an end 951g or 952g of the duct 950g is closed may depend on the position of a nearby AFG device or the airflow direction of the AFG device. In an embodiment, the end 952g may be open; accordingly, heated air may exit the heat dissipating structure 90g through the adjacent AFG device 900i or an opening (e.g., an opening at the end 952g) of the duct 950g.

Alternatively, the direction of an airflow caused by an AFG device (e.g., 900g) may be related to the position(s) of the AFG device(s) (e.g., 900g, 900h, or 900i) of the heat dissipating structure 90g, or the position of opening(s) (e.g., an opening at the end 952g) of the duct 950g.

The number, the temperature, or the power density of memory chips (e.g., 991) of a memory module (e.g., 990) may be a determining factor. For example, the number (e.g., 3) of AFG devices (e.g., 900g, 900h, and 900i) of the heat dissipating structure 90g may be a function of the number or the power density of memory chips (e.g., 991) of a memory module (e.g., 990) disposed adjacent to the heat dissipating structure 90g. The distance between two adjacent AFG devices (e.g., 900g and 900h) may be a function of the number of or the power density of the memory chips located between them. The strength of an airflow caused by an AFG device (e.g., 900g) may be controllable according to the temperature of the memory modules; alternatively, air pulses generated by an AFG device (e.g., 900g) may flow as a continuous stream or a periodic stream to regulate the temperature of the memory modules.

Note that, chips shown/stated in the above being memory chips are for illustration purpose, which is not limited to being memory. Some chip(s) shown in the above may be replaced with/by other kinds of (semiconductor) chip(s), which is also within the scope of the present invention. For example, some chip(s) may be CPU/GPU (center/graphic processing unit), controller, DRAM, NAND flash, etc. Heat dissipating structure of the present invention can be disposed on, by or over such chip(s) to dissipate heat.

Figure 9:
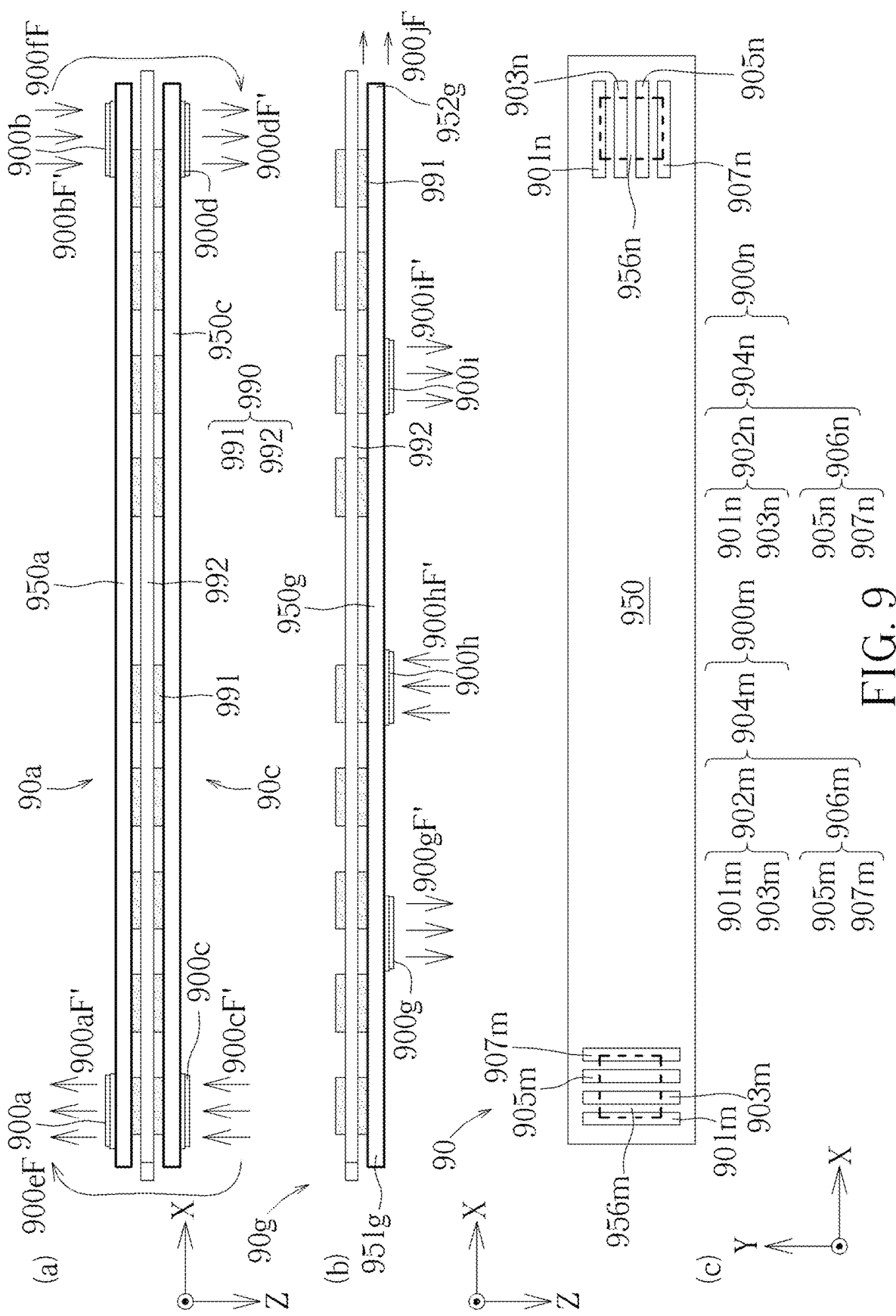
FIG. 9 illustrates schematic diagrams of heat dissipating structures according to embodiments of the present invention.

In FIG. 5, the structure and operation of the AFG device 500b are similar to those of the AFG device 500a, but are not limited thereto. For example, FIG. 9 (c) illustrates a top-view schematic diagram of a film structure 904m and a film structure 904n with respect to a duct 950 of a heat dissipating structure 90 according to an embodiment of the present invention. As shown in FIG. 9 (c), the film structures 904m and 904n, disposed above openings 956m and 956n of the duct 950, differ in configuration. This may help reduce resonance.

In FIG. 9 (c), the orientation of a flap pair (e.g., 906m) of an AFG device 900m is different from that of a flap pair (e.g., 906n) of an AFG device 900n. For example, the symmetry plane of a flap (e.g., 907m) in the AFG device 900m is perpendicular to the symmetry plane of a flap (e.g., 907n) in the AFG device 900n. Apart from the orientation, the structure and operation of the AFG devices 900m and 900n may be the same or different.

In an embodiment, the structure and operation of two adjacent flap pairs may be identical. For example, two flaps 901m and 903m, which are opposite to each other to constitute a flap pair 902m of the AFG device 900m, are actuated to move in opposite directions to create a VV between them. Similarly, the adjacent flap pair 906m may also be actuated to form a VV between its flaps 907m and 905m, with the flap 905m positioned next to the flap 903m without a slit in between. Because of the similarity, all the VVs of AFG device 900m may be closed at the same time, and likewise, they may be opened concurrently. As the adjacent flaps 903m and 905m of the two neighboring flap pairs 902m and 906m moves in opposite directions with their bottom electrodes electrically connected, current would flow between the two neighboring flap pairs 902m and 906m, which contributes to a reduction in overall power consumption.

In an embodiment, the structure and operation of two adjacent flap pairs may differ. For example, a flap pair 902n of the AFG device 900n may generate (first) air pulses toward the opening 956n in response to demodulation signals and a modulation signal, while a flap pair 906n of the AFG device 900n may generate (second) air pulses toward the same opening 956n in response to different demodulation signals and another modulation signal. A demodulation signal for a flap (e.g., 901n) of the flap pair 902n may be a delayed version of a demodulation signal for a flap (e.g., 905n) of the flap pair 906n (e.g., delayed by $T_{CY}/2$, half of the operating cycle time $T_{CY}$). Moreover, the modulation signal of the flap pair 902n may be viewed as the inverse of or a polarity-inverted version of the modulation signal of the flap pair 906n. Correspondingly, the first air pulses and the second air pulses may be mutually and temporally interleaved to increase (e.g., double) the pulse rate.

In an embodiment, the operation of two flap pairs in different AFG devices may differ. For example, a demodulation or modulation signal for a flap (e.g., 901m) of the flap pair 902m may be a delayed version of a demodulation or modulation signal for a flap (e.g., 901n) of the flap pair 902n.

Figure 14:
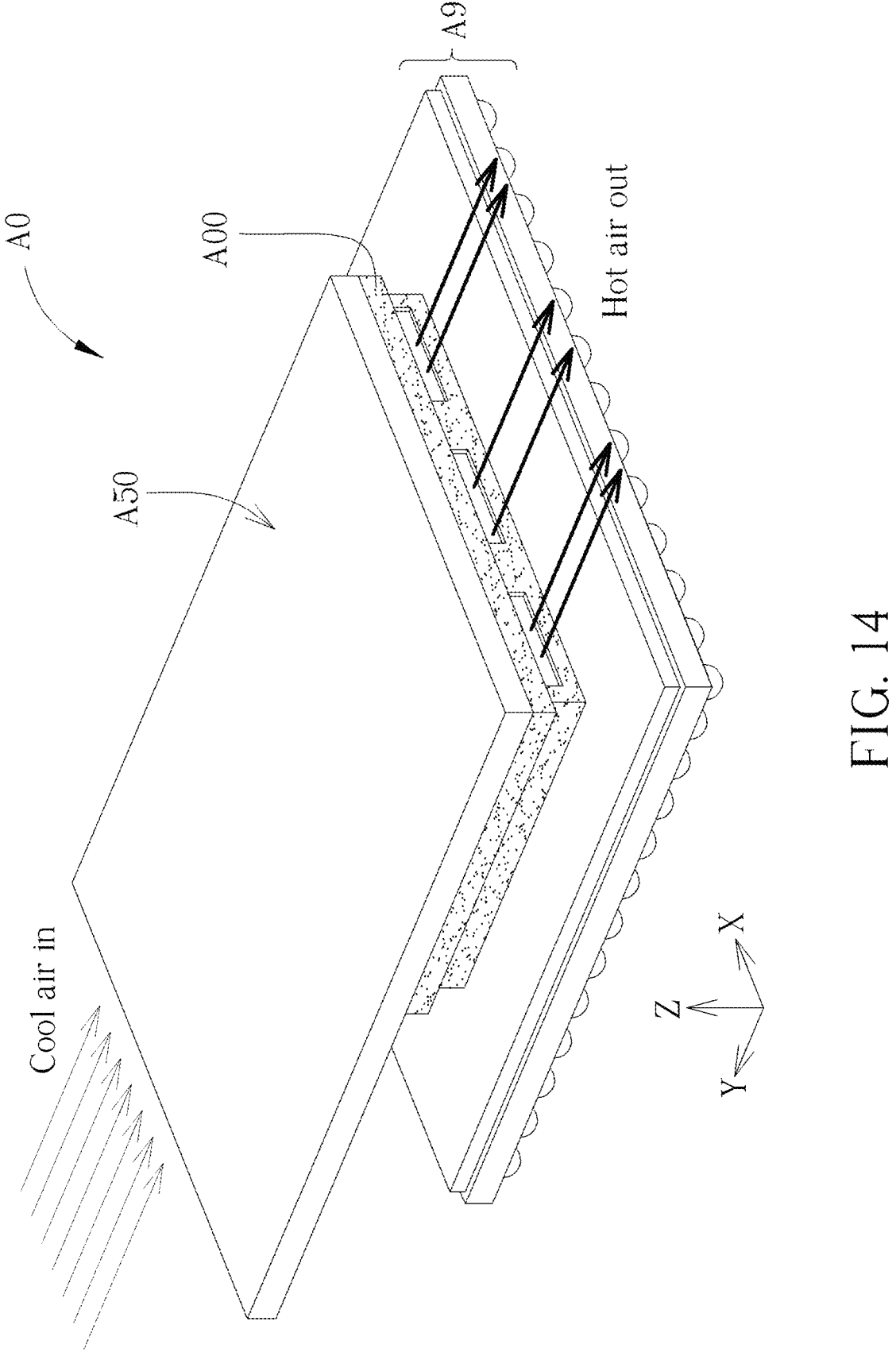
FIG. 14 to FIG. 16 are schematic diagrams of heat dissipating structures according to embodiments of the present invention.
Figure 15:
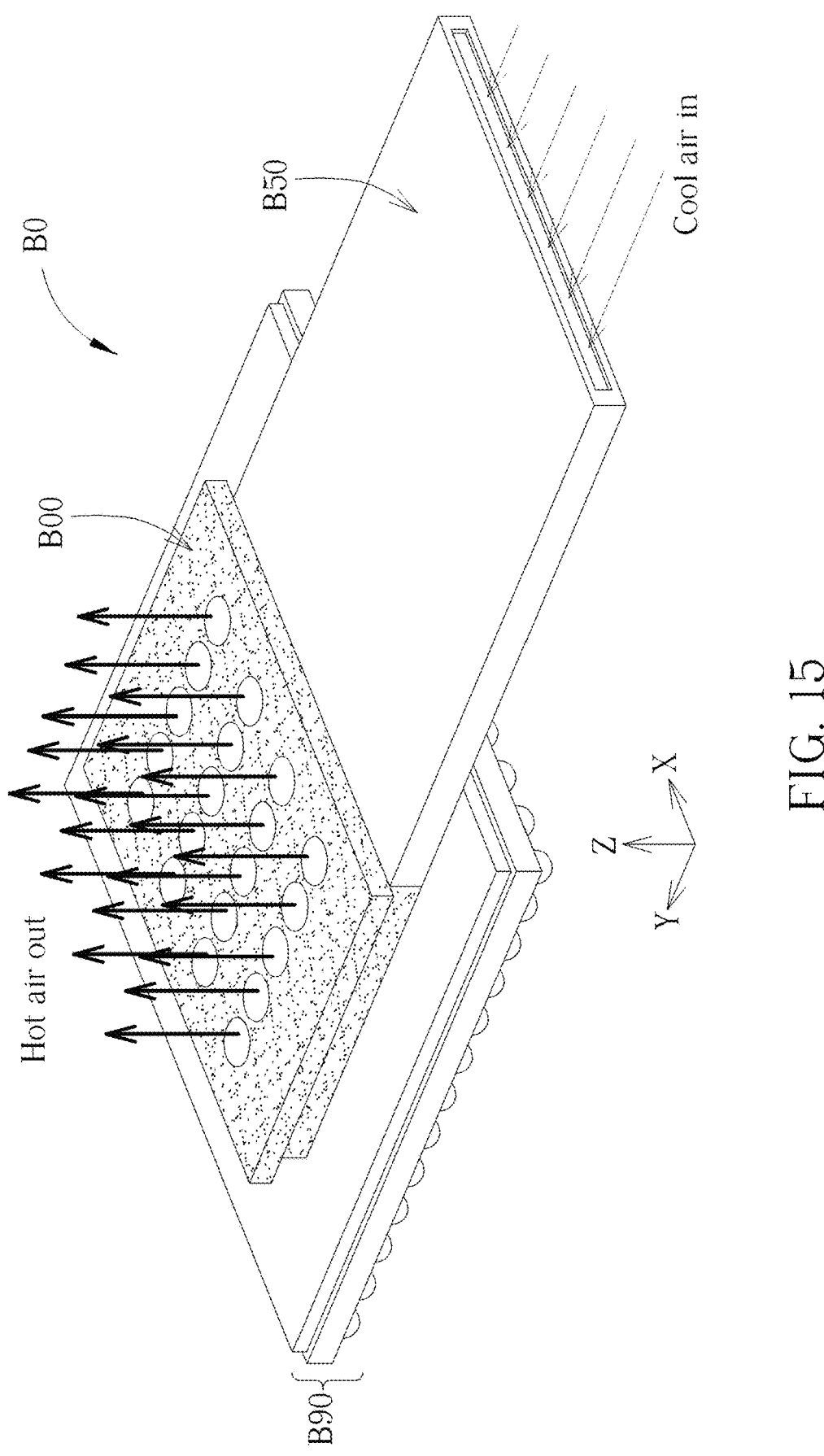

FIG. 14 or 15 illustrates a schematic diagram of a heat dissipating structure A0/B0 according to an embodiment of the present invention. The heat dissipating structure A0/B0 comprises a duct A50/B50 and an AFG device A00/B00. The duct A50/B50 has a channel (or an air pathway) formed therewithin. The AFG device A00/B00 generates an airflow flowing through the channel. Specifically, the AFG device A00/B00 draws in cool air and exhausts hot/warm air through the channel formed within the duct A50/B50.

The heat dissipating structure A0/B0 may be disposed on, by or over a semiconductor device A90/B90. The airflow generated by the AFG device A00/B00 is configured to dissipate heat generated from a semiconductor device A90/B90. In an embodiment, the semiconductor device A90/B90 may comprise an FCBGA (Flip Chip-Ball Grid Array) package, but not limited thereto.

Figure 16:
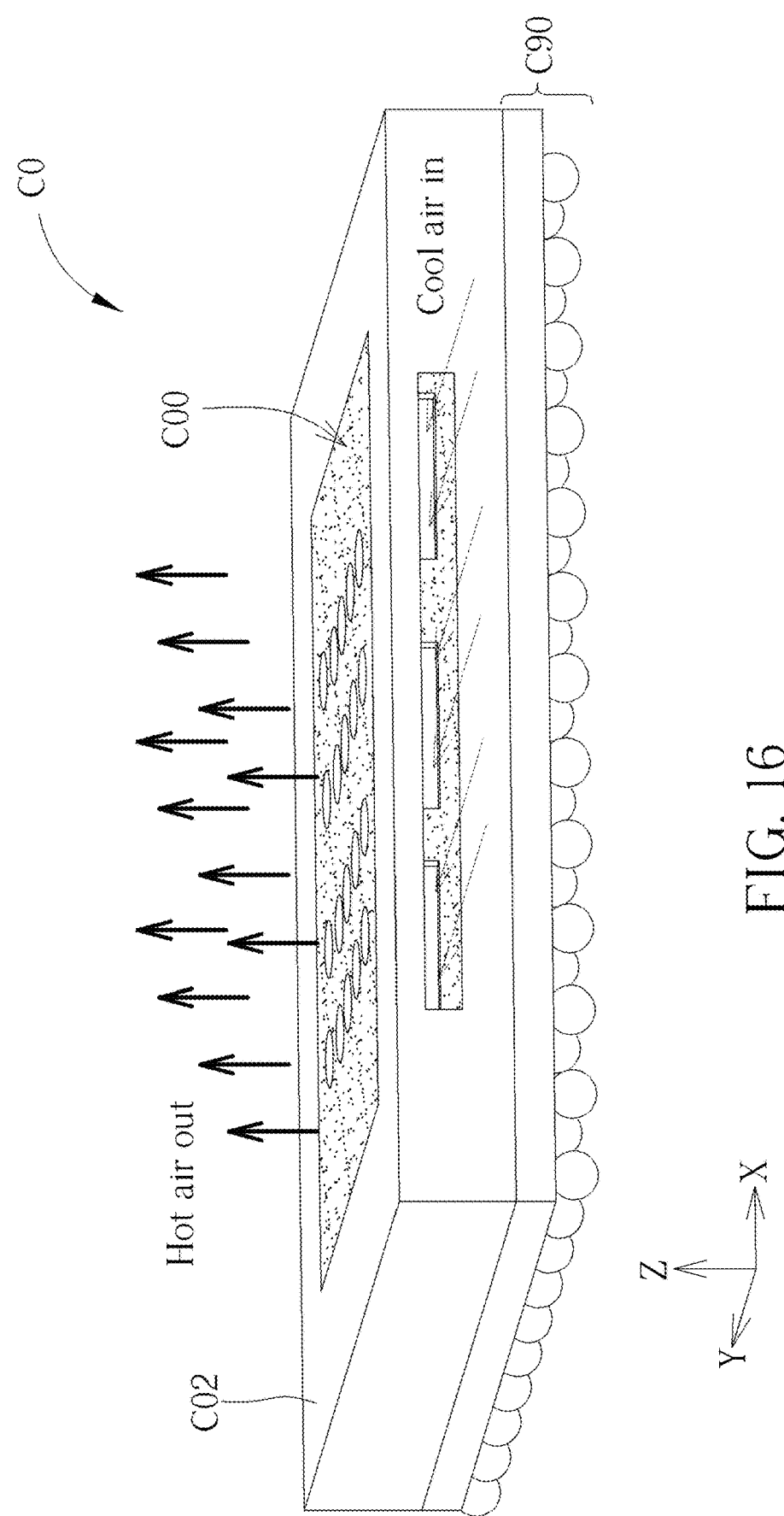

FIG. 16 illustrates a schematic diagram of a heat dissipating structure C0 according to an embodiment of the present invention. The heat dissipating structure C0 comprises an AFG device C00 disposed on, by or over a semiconductor device C90, which may also comprise an FCBGA package. Duct of the heat dissipating structure C0 is omitted in FIG. 16. In FIG. 16, the AFG device C00 is molded over the semiconductor device C90 via a molding material C02.

In FIGS. 14-16, a front side of the AFG device A00/B00/C00 is disposed toward a first direction (−Z) and/or toward the semiconductor device A90/B90/C90, and a back side of the AFG device A00/B00/C00 is disposed toward a second direction (+Z) opposite to the first direction. In addition, the AFG device may exhaust hot air toward a direction parallel to the +Z direction or toward a direction perpendicular to the +Z direction, where the Z direction is perpendicular to the front/back side (parallel to the XY plane) of the AFG device.

Figure 17:
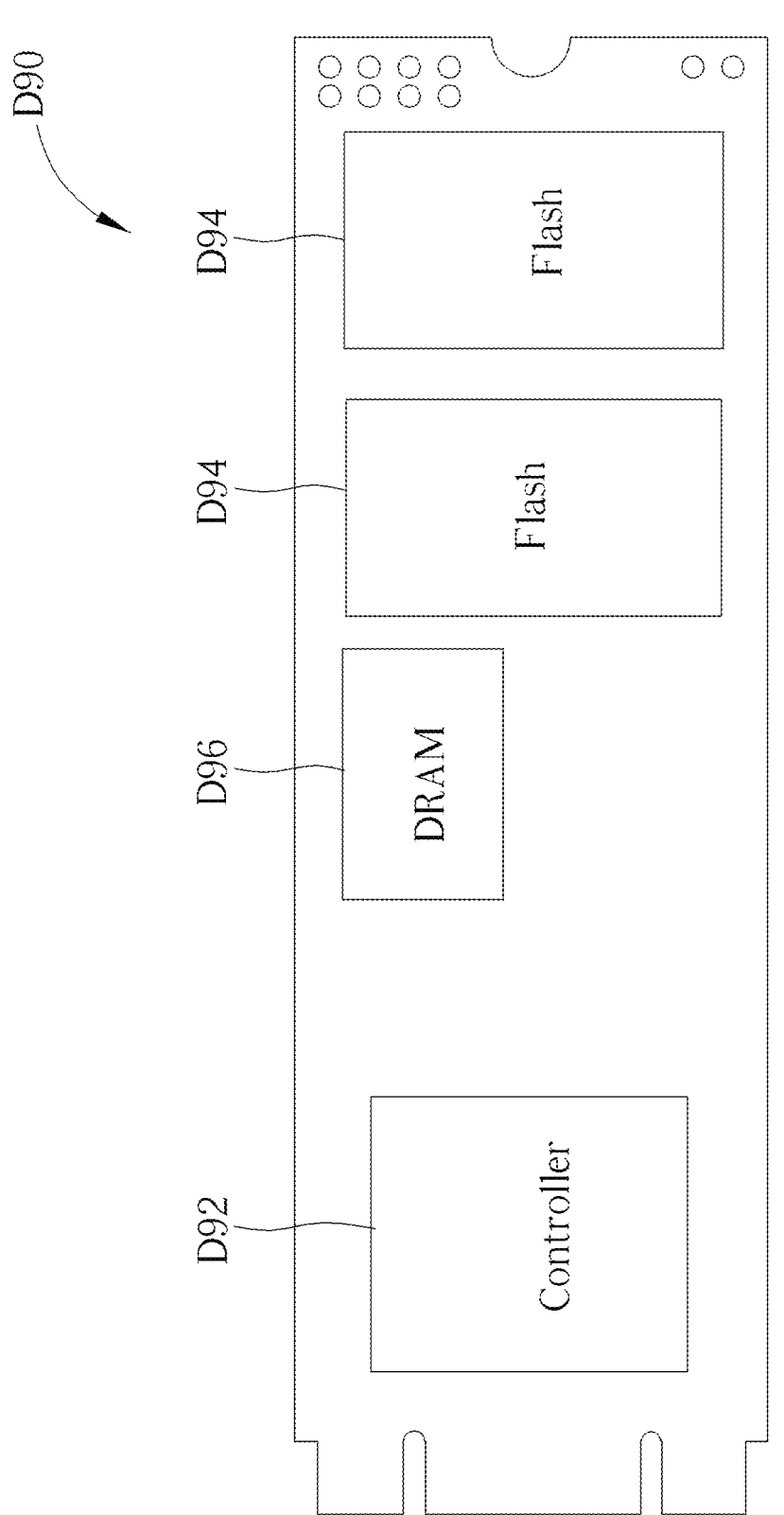
FIG. 17 illustrates a schematic diagram of a top view of a semiconductor device according to an embodiment of the present invention.

FIG. 17 illustrates a schematic diagram of a top view of a semiconductor device D90 according to an embodiment of the present invention. The semiconductor device D90 may be or comprise an SSD (solid-state driver, also can be regarded as a kind of memory module), which comprises a controller D92 and flash memory D94. The flash memory D94 may be NAND flash memory. Optionally, the SSD D90 may comprise a DRAM D96 (DRAM: dynamic random-access memory).

The heat dissipating structure of the present invention may be disposed on, by or over the semiconductor device or SSD D90, in order to dissipate heat generated by the controller D92, the DRAM D96 or the flash memory D94, which would facilitate the operation of the SSD D90.

The use of ordinal terms such as "first" and "second" does not by itself imply any priority, precedence, or order of one element over another, the chronological sequence in which acts of a method are performed, or the necessity for all the elements to be exist at the same time, but these terms are simply used as labels to distinguish one element having a certain name from another element having the same name.

The term "substantially" generally implies that a small deviation may or may not present. For instance, the term "substantially parallel" or "substantially along" indicates that the angle between two components may be less than or equal to a certain threshold (e.g., 5, 1, or 0.1 degrees). The term "substantially aligned" indicates that a deviation between two components may be less than or equal to a certain threshold (e.g., 1 or 0.1 micrometers or milliseconds). The term "substantially the same" indicates that a deviation falls within a certain percentage (e.g., 5%, 1%, or 0.1%).

The technical features described in the embodiments of the present invention may be mixed or combined in various ways as long as there are no conflicts between them.

The heat dissipating structure of the present invention may facilitate direct-to-chip cooling using micro-ducting for cool air intake or hot air exhaust. Moreover, the heat dissipating structure may enhance heat removal on heat sinks, spreaders, or vapor chambers. Because of its high heat dissipation ability, the present invention can reduce the reliance on expensive materials and help avoid performance throttling.

To sum up, the AFG device for the heat dissipating structure of the present invention can be compact while creating significant airflow. By effectively moving air across a single component or chip at the device level, the present invention has the potential to transform conventional approaches to thermal management.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A heat dissipating structure, comprising:
   a duct, having a channel formed in the duct; and
   an airflow generating device;
   wherein the heat dissipating structure is disposed on, by or over a semiconductor device and configured to dissipate heat generated from the semiconductor device;
   wherein the airflow generating device is configured to generate an airflow flowing through the channel within the duct to dissipate the heat generated from the semiconductor device;
   wherein the airflow generating device comprises a flap pair;
   wherein the flap pair is configured to receive a modulation signal to perform a common-mode movement;
   wherein the flap pair is configured to receive a demodulation signal to perform the differential-mode movement.

2. The heat dissipating structure of claim 1,
   wherein a length of the duct in a first direction is greater than a width or a thickness of the duct;
   wherein air within the duct substantially moves in the first direction.

3. The heat dissipating structure of claim 1,
wherein the semiconductor device comprises a memory module.

4. The heat dissipating structure of claim 3,
wherein the duct has a first surface and a second surface opposite to the first surface;
wherein the airflow generating device is disposed directly on the first surface;
wherein the second surface contacts a board or a memory chip of the memory module.

5. The heat dissipating structure of claim 3, wherein the duct is positioned between two memory modules positioned opposite to each other.

6. The heat dissipating structure of claim 1,
wherein the semiconductor device comprises a controller and a flash memory;
wherein the duct overlaps the controller or the flash memory.

7. The heat dissipating structure of claim 1,
wherein the semiconductor device further comprises a DRAM (dynamic random-access memory);
wherein the duct overlaps the DRAM.

8. The heat dissipating structure of claim 1,
wherein the semiconductor device comprises a plurality of chips;
wherein the duct overlaps the plurality of chips.

9. The heat dissipating structure of claim 1,
wherein the semiconductor device comprises an FCBGA (Flip Chip-Ball Grid Array) package.

10. The heat dissipating structure of claim 1,
wherein the semiconductor device comprises a solid state driver (SSD).

11. The heat dissipating structure of claim 1, comprising a plurality of airflow generating devices.

12. The heat dissipating structure of claim 1, comprising a first airflow generating device configured to generate a first airflow toward the channel; and
a second airflow generating device configured to generate a second airflow away from the channel.

13. The heat dissipating structure of claim 1,
wherein the airflow generating device comprises a film structure;
wherein the film structure is configured to be actuated to generate a plurality of air pulses at an ultrasonic pulse rate.

14. The heat dissipating structure of claim 13,
wherein the film structure comprises the flap pair, the flap pair comprises a first flap and a second flap opposite to each other;

wherein the flap pair is configured to perform the differential-mode movement and to form a virtual valve or to form an opening at an ultrasonic opening rate which is synchronous with the ultrasonic pulse rate.

15. The heat dissipating structure of claim 14,
wherein the virtual valve is closed within a period corresponding to a first transition time of the first flap and a second transition time of the second flap.

16. The heat dissipating structure of claim 1,
wherein a modulation frequency of the modulation signal is twice of a demodulation frequency of the demodulation signal.

17. The heat dissipating structure of claim 1, wherein the duct is a thermal conductive duct.

18. The heat dissipating structure of claim 1, wherein the duct comprises a first opening.

19. The heat dissipating structure of claim 1,
wherein the airflow generating device is molded over the semiconductor device via a molding material.

20. The heat dissipating structure of claim 1,
wherein a front side of the airflow generating device is disposed toward a first direction and toward the semiconductor device;
wherein a back side of the airflow generating device is disposed toward a second direction opposite to the first direction.

21. The heat dissipating structure of claim 1,
wherein the airflow generating device exhausts air toward a direction perpendicular or parallel to a front side of the airflow generating device.

22. A heat dissipating method, comprising:
forming a channel over a semiconductor device; and
generating an airflow, by an airflow generating device, through the channel;
wherein the airflow dissipates heat generated from the semiconductor device;
wherein the airflow generating device comprises a flap pair;
wherein the flap pair receives a modulation signal to perform a common-mode movement;
wherein the flap pair receives a demodulation signal to perform the differential-mode movement.

23. The heat dissipating method of claim 22, comprising:
forming a duct, wherein the channel is formed within the duct.

24. The heat dissipating method of claim 22,
wherein the duct is a thermal conductive duct.

* * * * *